US006802986B2

(12) United States Patent
Nakano

(10) Patent No.: US 6,802,986 B2
(45) Date of Patent: Oct. 12, 2004

(54) LOW-ABERRATION DEFLECTORS FOR USE IN CHARGED-PARTICLE-BEAM OPTICAL SYSTEMS, AND METHODS FOR FABRICATING SUCH DEFLECTORS

(75) Inventor: Katsushi Nakano, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/197,309

(22) Filed: Jul. 16, 2002

(65) Prior Publication Data

US 2003/0025085 A1 Feb. 6, 2003

(30) Foreign Application Priority Data

Jul. 16, 2001 (JP) ........................................ 2001-214792

(51) Int. Cl.[7] .......................... H01B 13/00; H01F 7/06
(52) U.S. Cl. ....................................... 216/13; 29/602.1
(58) Field of Search ................. 216/13, 22; 250/396 R, 250/396 ML, 397, 398, 399, 400; 29/602.1; 335/213; 313/440

(56) References Cited

U.S. PATENT DOCUMENTS

| | | | | |
|---|---|---|---|---|
| 5,729,887 A | * | 3/1998 | Irie | ........................ 29/602.1 |
| 6,153,885 A | * | 11/2000 | Kendall | ................ 250/396 ML |
| 6,461,680 B2 | * | 10/2002 | Pinckney | .................. 427/383.1 |
| 6,541,779 B2 | * | 4/2003 | Fujiwara | ................... 250/491.1 |
| 2002/0112963 A1 | * | 8/2002 | Nakano et al. | .............. 205/118 |

* cited by examiner

Primary Examiner—P. Hassanzodet
Assistant Examiner—Roberts Culbert
(74) Attorney, Agent, or Firm—Klarquist Sparkman, LLP

(57) ABSTRACT

Deflectors are disclosed that are suitable for use in various charged-particle-beam (CPB) optical systems as used, for example, in CPB microlithography systems. The deflectors produce a strong magnetic beam-deflecting field when energized with a relatively small electrical current. The beam-deflecting field thus produced is stable with respect to temperature changes, is little affected by eddy currents, and exhibits low aberration caused by manufacturing tolerances of the coil and core. In an exemplary method for manufacturing such a deflector, a magnetic-tape laminate is used as the core. Also, high-precision positioning of the coil and the magnetic-tape laminate is performed using photolithography and electrocasting. Positioning of the magnetic-tape laminate can be performed using a resist pattern formed by photolithography.

9 Claims, 15 Drawing Sheets

LOW-ABERRATION DEFLECTORS FOR USE IN CHARGED-PARTICLE-BEAM OPTICAL SYSTEMS, AND METHODS FOR FABRICATING SUCH DEFLECTORS

FIELD

This disclosure pertains to charged-particle-beam (CPB) optical systems and to systems, such as CPB microlithography systems, incorporating such optical systems. Microlithography is a key technology used in the manufacture of microelectronic devices such as integrated circuits, magnetic-recording heads, displays, and micromachines. More specifically, the disclosure pertains to deflectors used in CPB optical systems and to methods for manufacturing such deflectors. Compared to conventional deflectors, the deflectors disclosed herein exhibit reduced aberration, produce strong beam-deflecting fields at low excitation currents being applied to the deflectors, exhibit low fluctuation of their deflecting magnetic fields with changes in temperature, and are relatively little influenced by eddy currents.

BACKGROUND

As the limitations of optical microlithography have become more apparent, a large research and development effort in recent years has been directed to charged-particle-beam (CPB) microlithography as a primary candidate for "next generation" lithography technology. By using a charged particle beam (e.g., an electron beam), CPB microlithography offers prospects of improved pattern-transfer resolution, compared to optical microlithography, for reasons similar to the reasons for which electron microscopy produces better imaging resolution than optical microscopy. Thus, CPB microlithography offers the prospect of producing microelectronic devices (e.g., semiconductor integrated circuits) having smaller and more densely packed active-circuit elements than can be produced by conventional means. In CPB microlithography, exemplified by electron-beam projection microlithography, a pattern is defined on an "EB reticle," from which the pattern is "transferred" with reduction (demagnification) to a "sensitive" substrate using a projection-optical system of a CPB optical system. "Sensitive" means that the surface of the substrate is coated with a substance, termed a "resist," that is imprintable with an image of the pattern as carried to the surface by the beam.

A reticle suitable for use in CPB microlithography typically is fabricated from a silicon wafer having a diameter of, for example, about 200 mm. The exposure field of an electron-optical system is only about 250 µm wide, rendering most full-die exposures from a reticle currently impossible. Consequently, exposure of an entire pattern from the reticle to the substrate involves defining the pattern on a reticle that is "segmented" into a large number of portions (usually termed "subfields") each defining a respective portion of the overall pattern. The subfields are exposed in respective exposure "shots" to the substrate, on which the subfield images are placed to form a contiguous pattern on the substrate. Thus, large dies can be exposed, including dies having dimensions of tens of millimeters square on the substrate. An exemplary technique in this regard is disclosed in U.S. Pat. No. 4,376,249, incorporated herein by reference.

With any of various types of CPB microlithography systems, an ability to deflect the charged particle beam laterally with respect to the optical axis is absolutely essential for having a functional system. Consequently, to such end, all CPB microlithography systems comprise multiple deflectors.

One type of deflector frequently employed in electron-beam optical systems is a "saddle" deflector. A saddle deflector is produced by winding an electrical coil around a square bobbin, then bending the coil part way in a saddle manner around the outer surface of a cylinder. Unfortunately, this method of forming a saddle coil yields inaccurately configured coil windings and poor precision from one deflector to the next. Manufacturing difficulties also are encountered while positioning deflector cores relative to the coil windings.

Another type of deflector frequently used in electron-beam optical systems is denoted a "vane-yoke" type of toroidal deflector, as shown in FIGS. 16($a$)–16($b$). A coil 34 of such a deflector is made by cutting (e.g., wire-cutting) a copper sheet to form a planar coil. A separate coil 34 is positioned on and applied to each side of a rigid, planar, insulative substrate 33 (e.g., quartz). Thus, each substrate 33 is provided with a "clockwise" coil 34 and a "counter-clockwise" coil 34. The clockwise coil 34 is applied to one side of the substrate 33, and the counter-clockwise coil is applied to the opposite side of the substrate. The respective inner termini of the coils 34 are electrically connected together, and the respective outer termini are connected to a power supply. Each such planar assembly is a respective "vane." The vanes 32 are radially positioned relative to each other about an optical axis 36 to form the deflector 31.

In an electron beam, the constituent propagating electrons repel each other. Consequently, an image carried by and formed by the beam can exhibit distortion and/or blur, especially at higher beam currents. This phenomenon is commonly known as the "Coulomb effect." If the beam current is reduced in an effort to decrease the Coulomb effect, then exposure time of an electron-beam microlithography system is lengthened, which can reduce the throughput of the system. "Throughput" is the number of workpieces (e.g., wafers) that can be processed (e.g., lithographically exposed) by the system per unit time.

Another way in which the Coulomb effect can be reduced is by decreasing the length of the column containing the electron-beam optical system. In a shorter column, the distance of beam propagation is correspondingly reduced, which reduces the time during which the electrons of the propagating beam are near each other sufficiently to repel each other. However, a shorter beam column usually results in the beam being deflected, by a given deflector, a shorter distance from the optical axis than experienced in a longer column. Hence, in a shorter column, achieving a desired lateral deflection of the beam requires that the deflector coil be energized with a higher electrical current than an otherwise similar deflector in a longer column. The elevated electrical current results in more heat being generated in the coil. Unless this heat is rapidly and efficiently dissipated from the deflector coil, the deflector itself is heated. Thus, the deflector exhibits a greater variation in temperature, which produces a correspondingly greater variation in performance.

Reducing the column length of a CPB optical system also requires that each deflector be made smaller than would be allowable in a longer column. As a result, the deflectors in a short column are very close to other components of the column, thereby concentrating heat in a smaller area around the deflector. Achieving sufficient cooling of the deflector for more accurate and precise operation is correspondingly more difficult. As a result, the deflectors tend to experience greater temperature fluctuation during operation, yielding correspondingly greater thermal expansion and contraction of the deflectors. As a deflector expands, the magnetic field generated by the deflector increases in magnitude, which increases the magnitude of beam deflection, at an applied current, imparted by the deflector. As the imaging position of the beam fluctuates with temperature changes of the deflector, the accuracy and precision with which the subfield images are stitched together on the substrate correspondingly fluctuates.

One way in which to increase the magnitude of the deflection field produced by a deflector energized with a relatively small electrical current is to configure the coil as being wound around a magnetic "core." Because deflectors usually generate high-frequency magnetic fields, ferrite often is used for the core because of its high electrical resistance, which is important for reducing eddy currents in the deflector. This type of deflector is able to create a relatively strong deflecting field in response to a relatively low current applied to the coil, and is therefore utilized in many different CPB optical devices.

Using an "MOL lens" (Moving Objective Lens; see Goto et al., *Optik* 48:255–270 (1977)) is a well-known technique for deflecting an electron beam in electron-beam microlithography systems. A MOL lens achieves deflection of an electron beam while reducing distortion and blur (aberration). A MOL lens conventionally comprises (a) a magnetic lens for converging the beam and (b) a deflector, comprising a ferrite core, for deflecting the beam. The lens and deflector are disposed concentrically around the optical axis of the MOL lens. Using such a lens configuration, it is possible to superpose on the lens field a second magnetic field having a direction that intersects the lens field. The resultant field imparts a lateral shift to the principal point of the lens. An electron beam passing through the lens in a generally axial direction is caused always to pass near the principal point of the lens, even whenever the principal point is laterally shifted. This movement of the principal point reduces deflection aberrations of the lens. Otherwise, merely deflecting an electron beam causes the beam to pass relatively far away from the principal point, which causes a correspondingly greater deflection aberration.

A MOL lens for a CPB optical system typically produces a respective lensing magnetic field that is substantially continuous. The deflector serving to shift the principal point of the MOL lens, in contrast, typically produces a beam-shifting field that rapidly changes in a high-frequency manner synchronously with deflection of the beam occurring outside the MOL lens. The high-frequency AC magnetic field produced by the deflector acts on the magnetic lens of the MOL lens, usually situated radially outwardly of the deflector. The magnetic lens typically comprises a copper-coil winding and a pole piece located peripherally relative to the coil winding. Whenever an AC magnetic field acts on such a magnetic lens, a corresponding eddy current is generated in the lens. The eddy current tends to slow the rate at which the deflecting field produced by the deflector can settle after being changed, which produces a corresponding reduction in the response rate of the deflector.

A technique as shown in FIGS. 17(*a*)–17(*b*) conventionally is used for preventing these eddy currents and/or their effects. FIG. 17(*a*) illustrates a conventional magnetic lens disposed coaxially with a deflector used to deflect an electron beam propagating in a generally axial direction through the lens. A deflecting coil 11 is disposed inboard, and a magnetic-lens coil 12 is disposed outboard relative to the axis 15. A pole piece 13 is disposed around the outer periphery of the magnetic-lens coil 12 so as to "cover" the magnetic-lens coil 12. A ferrite "stack" 14 is situated concentrically between the deflecting coil 11 and the magnetic lens coil 12, and serves to magnetically shield the magnetic lens coil 12 from the AC magnetic field induced by the deflecting coil 11.

The effect of the ferrite stack 14 is shown in FIG. 17(*b*), which is a transverse section perpendicular to the optical axis 15 in FIG. 17(*a*). The magnetic field (denoted by lines of force 16) generated from the portion of the deflecting coil 11 located near the optical axis 15 passes near the optical axis 15 and then returns to the deflecting coil 11. Meanwhile, the magnetic field (denoted by lines of force 17) generated from the portion of the deflecting coil 11 located more remotely from the optical axis 15 extends into the ferrite stack 14 surrounding the deflecting coil 11, around the outside of the deflecting coil 11, and then back to the deflecting coil 11. The magnetic field extending around the outside of the deflecting coil 11 enters the surrounding ferrite stack 14 and does not reach the magnetic lens coil 12 or the pole piece 13.

A deflector used in a CPB microlithography system desirably comprises a coil and a core made with extremely high accuracy and precision. Otherwise, a difference will be exhibited between the expected magnetic field and the actual magnetic field produced by the deflector whenever the charged particle beam is being deflected by the deflector. This difference results in deflection aberrations, which can be a serious problem. Unfortunately, a sufficiently accurate method for manufacturing such a deflector has not yet been devised. Consequently, troublesome deflection aberrations always are encountered in CPB microlithography.

Also, the use of ferrite in a deflector poses two major problems. The first is that the magnetic permeability of ferrite varies with changes in temperature. In general, the Curie point of a material is the temperature at which the magnetic permeability of the material is at a minimum; the Curie point of ferrite is approximately 200° C. Whenever such a deflector is used at room temperature, which is considerably below the Curie point of ferrite, the permeability of the deflector varies with deflector temperature.

The second problem is that considerable variation exists in the composition of ferrite. Ferrite is manufactured by mixing the constituent materials in a powdered state; mixing of powders is inherently not uniform. Also, magnetic characteristics of ferrite are affected by the conditions under which sintering occurs, which is another source of variation in the behavior of ferrite. In any event, the resulting variations in the permeability of ferrite result in undesirable astigmatism and the like in the deflector.

Therefore, in a conventional deflector having a ferrite core, a change in ferrite temperature causing a corresponding change in the permeability of the ferrite (due to the first problem noted above) causes a corresponding variation in the magnitude of the deflecting magnetic field produced by the deflector. As a result, whenever the deflector is energized, the charged particle beam is not deflected by the deflector in quite the desired manner. Also, due to the second problem noted above, astigmatism is greater.

The two ferrite problems noted above can cause the following to occur even in a MOL comprising a deflector including a ferrite stack. First, as noted above, magnetic permeability varies with corresponding changes in ferrite temperature. As shown in FIG. 17(*b*), part of the magnetic field from the deflector passes through to the inside of the ferrite stack. If the permeability of the ferrite were increased in this location, for example, the flux density (indicated by the number of lines of force) entering the ferrite stack also would increase. As a result, some of the magnetic flux that has crossed the optical axis passes to the outside of the deflector, causing a reduction of the deflection magnetic field on the optical axis. Thus, the magnitude of beam deflection produced by the deflector is not as expected. As noted above, the second problem causes increased astigmatic behavior and the like imparted to the beam.

SUMMARY

In view of the shortcomings of the prior art as summarized above, the present invention provides, inter alia, deflectors exhibiting, compared to conventional deflectors, very low aberration while generating strong deflecting magnetic fields at low applied electrical current to coils of the deflectors. The low aberration is attributable to the magnetic-tape laminate used to form the core of the deflectors. The laminate of magnetic tape is more uniform than the ferrite conventionally used in deflector coils, and thus exhibits less variation in magnetic permeability. The deflectors also exhibit very little fluctuation in the magnitude of the deflecting magnetic field with variations in deflector temperature. Additionally, the deflectors are affected very little by eddy currents. Thus, the deflectors achieve high-speed positioning of the charged particle beam, which is especially suitable for high-precision CPB microlithography. Also provided are methods for manufacturing such deflectors.

According to a first aspect of the invention, toroidal deflectors are provided. One embodiment of such a deflector comprises an annular core including a laminate of magnetic tape. At least one coil is situated relative to the core; when the coil is electrically energized the deflector produces a deflecting magnetic field. In deflectors having multiple coils, the coils may be positioned at substantially equi-angular positions from one another relative to the core. The magnetic tape may comprise a foil of magnetic metal. The magnetic tape of the annular core can be configured so as to be electrically energized to generate a lens field superposed on the deflecting magnetic field.

Another embodiment of a toroidal deflector comprises multiple vanes radially positioned around an optical axis. Each vane comprises a planar substrate having a respective electrically energizable coil attached to at least one major surface of the vane. The coil forms a substantially spiral pattern and defines a coil interior. A core comprising a laminate of magnetic tape is positioned in the coil interior. The magnetic tape can be a foil of magnetic metal.

In the embodiment summarized above, a second coil can be affixed to the opposite side of the vane. The second coil forms a substantially spiral pattern that desirably mirrors the first spiral pattern. The second coil may similarly define a second coil interior, in which a second core may be positioned.

The core can be positioned in the coil interior by alignment with multiple positioning features defined in the coil interior. The positioning features desirably are electrically insulated from the core.

The core can be configured to have a thickness that varies with radial distance from the optical axis of the deflector. For example, the thickness of the core can increase with increasing radial distance from the optical axis.

The core can be divided into multiple core segments that are electrically insulated from one another.

According to another aspect of the invention, saddle deflectors are provided that are formed on a cylindrical substrate. In one embodiment an outer electrically energizable coil is affixed to the outer surface in a first spiral pattern. The outer coil also defines an outer coil interior. A core comprising a laminate of magnetic tape is affixed to the outer surface and positioned in the outer coil interior. The saddle deflector can include an inner electrically energizable coil affixed to the inner surface in a second spiral pattern that mirrors the first spiral pattern. The cylindrical substrate can further comprise at least one through-hole defining an aperture between the inner and the outer surfaces. Thus, an end of the outer coil and an end of the inner coil can be electrically connected to each other at one of the through-holes. The other ends of the outer and inner coils can be disposed substantially adjacent to one another on the outer surface by positioning the end of the inner coil through a second through-hole. These ends are connectable to a power supply with wires that desirably are twisted together.

The core can be divided into multiple core segments that are electrically insulated from one another.

According to yet another aspect of the invention, biaxial saddle deflectors are provided. An embodiment of such a biaxial saddle deflector comprises a first saddle deflector substantially similar to the saddle deflector summarized above. The biaxial saddle deflector further comprises a second saddle deflector substantially similar to the first saddle deflector except that the second saddle deflector has an outer diameter smaller than the inside diameter of the first saddle deflector. Thus, the second saddle deflector is insertable coaxially into the first saddle deflector. The second saddle deflector can be oriented axially ninety degrees from the first saddle deflector. The saddle deflectors can comprise respective flanges for positioning the second saddle deflector relative to the first saddle deflector.

The first and second saddle deflectors can include respective cores affixed to the respective outer surfaces of the deflectors and positioned in respective coil interiors. The cores desirably each comprise a laminate of magnetic tape. The cores can be divided in multiple core segments.

According to yet another aspect of the invention, methods are provided for manufacturing a vane for use in a vane-yoke deflector. In an embodiment of the method, a coil pattern of metal is formed on a surface of a planar substrate. The surface of the substrate is coated with a thick-film resist. A desired coil profile and a desired core profile are patterned onto the resist using lithography. Non-cured portions of the resist are removed to reveal the coil pattern and a respective core location. Conductive metal is deposited in the coil pattern to form the coil. A core comprising a laminate of magnetic tape can be placed at the core location using an adhesive or the like. The core can be positioned with the aid of multiple positioning features formed on the surface in the core location. The core can be divided into multiple portions and/or machined to a desired shape. For instance, the core may be machined so that its cross-section increases proportionately with increasing axial distance from the optical axis of the deflector.

According to yet another aspect of the invention, methods are provided for manufacturing saddle deflectors. In an embodiment of such a method, a metal film is deposited on an outer surface of a cylindrical substrate to form a metal layer. The substrate is progressively submerged endwise into photolithographic resin. A coil profile is patterned in the resin on the outer surface of the substrate using a laser beam. Non-patterned portions of the resin are removed to reveal a coil pattern. A conductive metal is deposited in the coil pattern to form a coil. Remaining resin is then removed. A core can be formed and attached to the deflector. For example, multiple layers of magnetic tape are wound around a surface of a cylindrical mold and bound together to form a laminate. The core is formed by cutting the laminate into a desired shape. The core is removed from the cylindrical mold and placed into a coil interior formed on the cylindrical substrate. The core can be attached using an adhesive and guided into position using multiple positioning features formed on the substrate surface.

An inner coil can be formed by a procedure as summarized above. The inner coil may be axially oriented ninety degrees apart from the outer coil. At least one through-hole can be formed on the cylindrical substrate, through which respective ends of the inner coil and the outer coil can be connected.

The foregoing and additional features and advantages of the invention will be more readily apparent from the following detailed description, which proceeds with reference to the accompanying drawings.

BRIEF DESCRIPTION OF THE DRAWINGS

FIG. 6(d) depicts four unequally sized portions of the core.

DETAILED DESCRIPTION

The invention is described below in the context of representative embodiments, which are not intended to be limiting in any way. Also, the embodiments are described below in the context of use with an electron beam as an exemplary charged particle beam. It will be understood that the general principles disclosed herein are equally applicable to use of an alternative charged particle beam, such as an ion beam.

In general, the insertion of a magnetic core into a deflector generates a magnetic field that is several times stronger than that of a hollow deflector. Thus, a desired magnetic field can be attained with a lower current, resulting in less overall power usage. Using less power to drive the deflector tends to shorten the settling time of the deflector and also reduces electrical noise generated by the deflector.

In the embodiments discussed below, a laminate of magnetic tape is used to form deflector cores rather than the conventional ferrite. The number of magnetic tape layers used to form the laminate may range from a few layers to several thousand layers. The magnetic tape itself comprises a thin foil of magnetic metal. The foil may be, for instance, about 10 μm in thickness. The magnetic tape may further comprise an insulating tape, one side of which is attached to the thin foil. Thus, when the laminate is formed, each layer of magnetic tape is insulated from the other layers. Alternatively, the magnetic tape may comprise a tape that has magnetic metals on both surfaces. Thus, when the laminate is formed, an insulator may be inserted between each layer of magnetic tape. Once formed, the laminate may be, for instance, between 1 and 100 mm thick.

Magnetic tape, like ferrite, is well suited for use in a deflector core because it has a low electrical conductivity and is resistant to the formation of eddy currents. Magnetic tape, however, has several distinct advantages over ferrite. For instance, magnetic tape is manufactured by a process including a melting step that results in greater material uniformity than the powder-mixing step used in the manufacture of ferrite. Thus, magnetic tape exhibits smaller variations in magnetic permeability than ferrite. Additionally, the magnetic metal used to form the magnetic tape typically has a Curie point of about 500° C., which is much higher than the Curie point of ferrite. Thus, in a variable temperature environment, magnetic tape experiences only a slight variation in magnetic permeability compared to the variation exhibited by ferrite under similar temperature conditions.

Figure 1A:
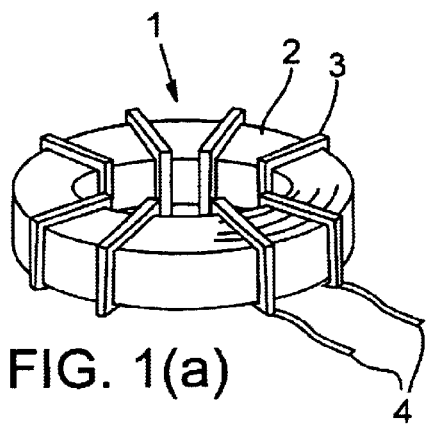
FIG. 1(a) is an oblique view of a deflector, according to the first representative embodiment, configured as a toroidal deflector.
Figure 1B:
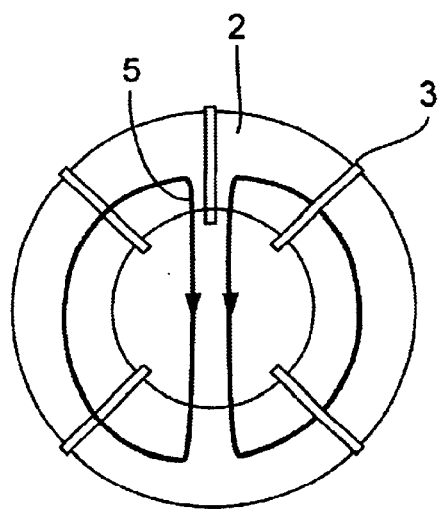
FIG. 1(b) is an axial end view of the deflector of FIG. 1(a), showing lines of force corresponding to the magnetic flux produced by the deflector.

A first representative embodiment is depicted in FIGS. 1(a)–1(b), which show a toroidal deflector 1. The deflector 1 comprises a toroidal laminate 2 of magnetic tape, multiple coils 3, and a respective pair of coil leads 4 for each coil (only one lead per coil is shown). The coils 3 are disposed radially at substantially equi-angular intervals on the magnetic-tape laminate, centered at the optical axis of the deflector 1. The magnetic-tape laminate 2 serves as a core for the coils 3, and conventionally would have been made of ferrite.

FIG. 1(b) illustrates a deflecting magnetic field as generated by the deflector 1. Whenever electrical current flows in the same circular directions in four adjacent coils 3, a corresponding magnetic field 5 (directed from top to bottom in the drawing) is generated. In the figure, the field 5 is directed vertically downward in the middle of the deflector 1. To generate a magnetic field extending left-right in the figure, electrical current is delivered appropriately to the remaining four adjacent coils 3.

Figure 2A:
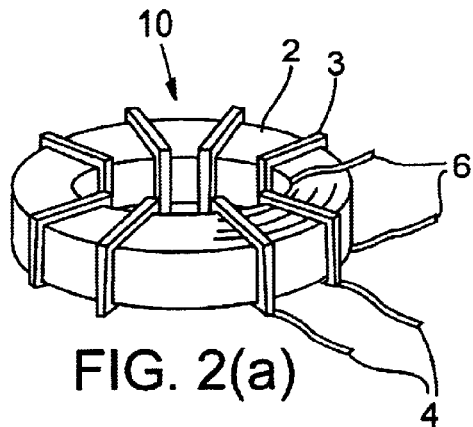
FIG. 2(a) is an oblique view of a magnetic lens-and-deflector unit (configured as a MOL lens), according to the second representative embodiment.
Figure 2B:
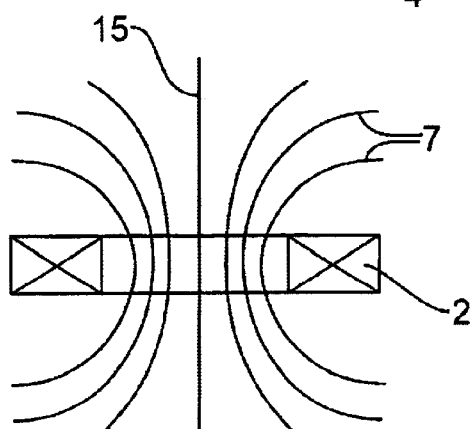
FIG. 2(b) is an elevational section of the unit shown in FIG. 2(a), showing the lens field.
Figure 2C:
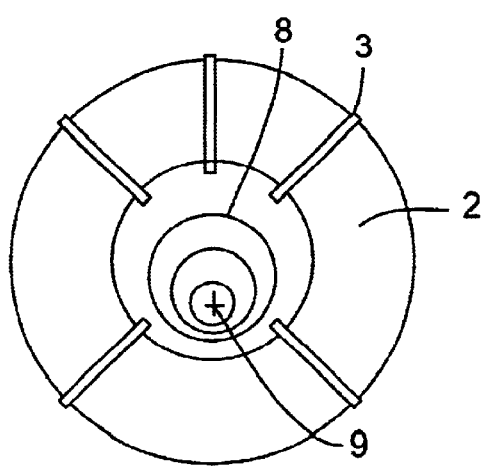
FIG. 2(c) is an axial end view of the unit of FIG. 2(a), showing a shifted lens axis.

FIGS. 2(a)–2(b) are simplified diagrams of a magnetic lens-deflector unit 10 according to a second representative embodiment. In FIG. 2(a) the unit 10 comprises a toroidal magnetic-tape laminate 2 to which power leads 6 are attached at the beginning and end of the wound magnetic tape, respectively. Whenever electrical current is delivered to the power terminals 6, the current flows around the magnetic-tape laminate 2 and generates a corresponding magnetic field (denoted by lines of force 7; see FIG. 2(b)). The magnetic field 7 extends as shown around the magnetic-tape laminate 2 and relative to the axis 15 of the lens-deflector unit 10. This magnetic field 7 acts as a lens field. Also, as in the first representative embodiment, a deflecting field is produced whenever respective electrical currents are delivered (via leads 4) to respective groups of four adjacent deflecting coils 3. This deflecting field is superposed on the lens field 7, and results in shifting of the lens field in the direction of the deflecting field, thereby providing MOL action. FIG. 2(c) illustrates MOL action by showing equi-potential lines 8 viewed in the axial direction of the lens-deflector unit 10. The principal point 9 of the lens-deflector unit 10 is indicated by the cross, which in the figure is shifted downward relative to the optical axis 15 of the unit (the optical axis is not shown in FIG. 2(c), but is understood to extend perpendicularly to the plane of the page from the center of the lens-deflector unit). Thus, a MOL can be obtained using fewer parts than used in a conventional MOL in which a separate magnetic lens is used for creating a lens field. Additionally, MOL action is obtained without having to use laminated ferrite.

Figure 3A:
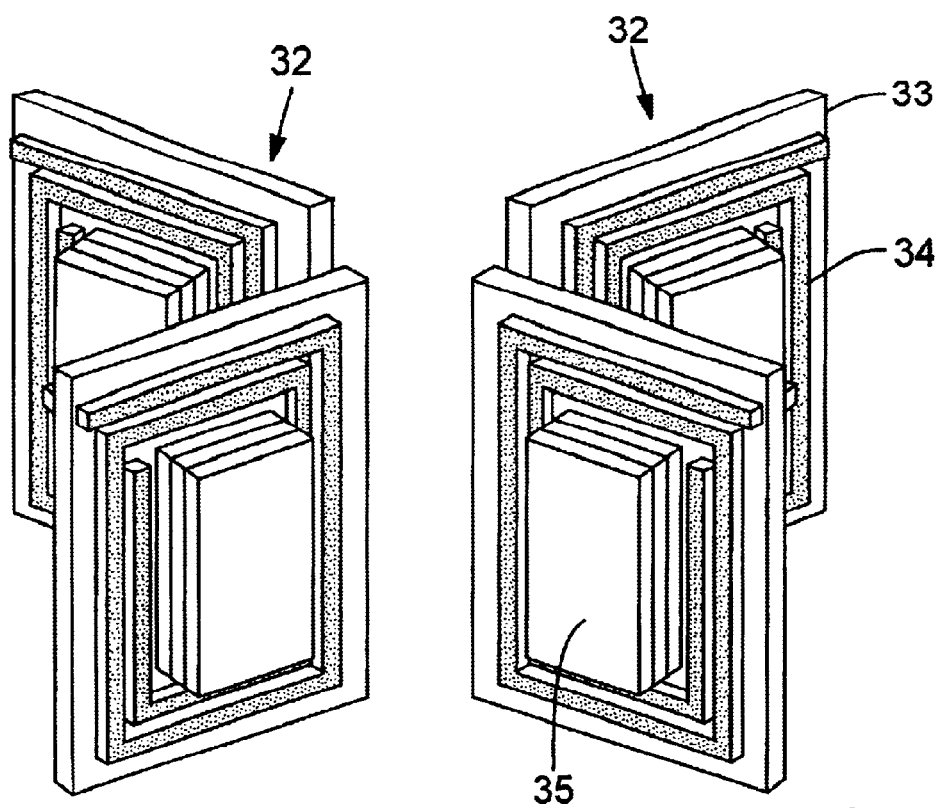
FIG. 3(a) is an oblique view of a deflector according to the third representative embodiment, showing four vanes.
Figure 3B:
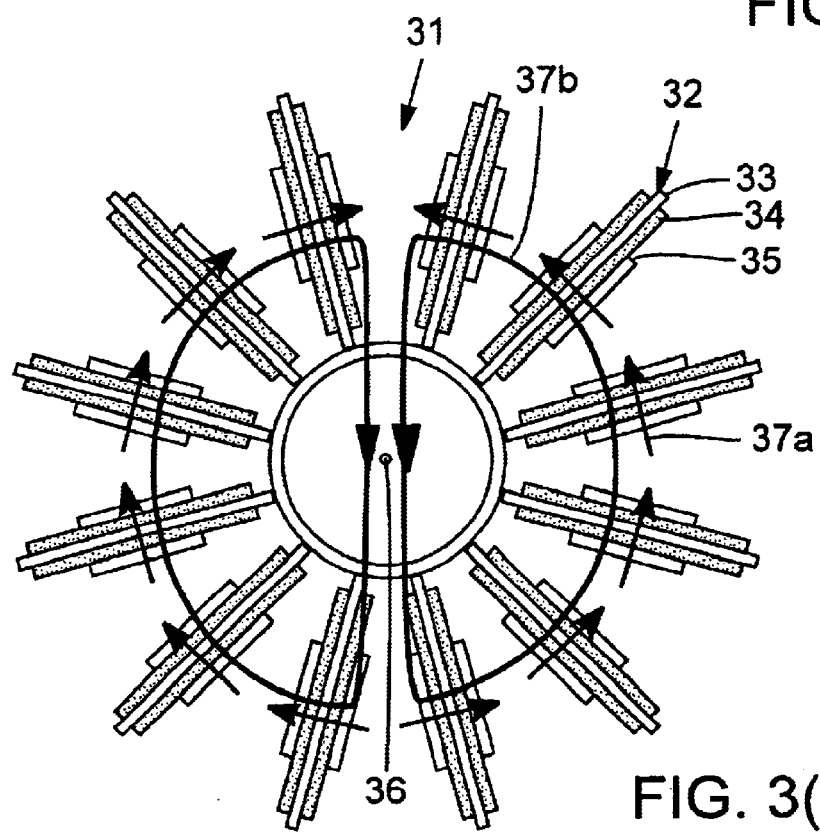
FIG. 3(b) is an axial end view of the deflector of FIG. 3(a) having 12 vanes.
Figure 4A:
FIGS. 4(a)–4(e) depict the results of respective steps of a method, according to the fourth representative embodiment, for manufacturing a deflector including cores configured as magnetic-tape laminates.
Figure 4B:
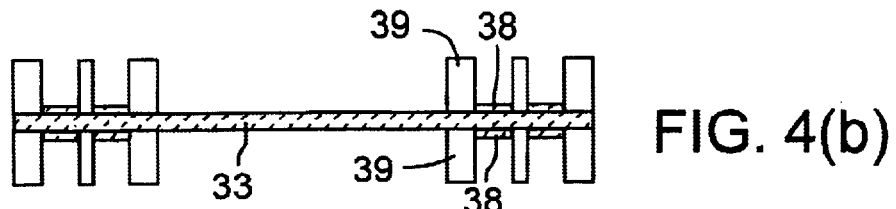
Figure 4C:
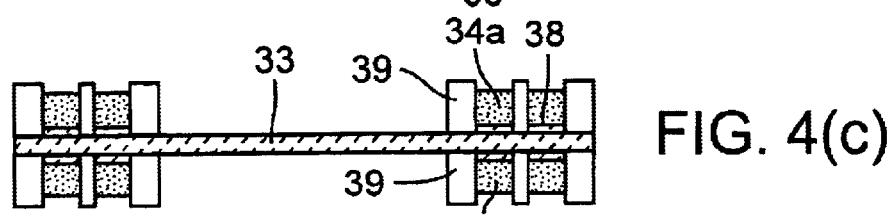
Figure 4D:
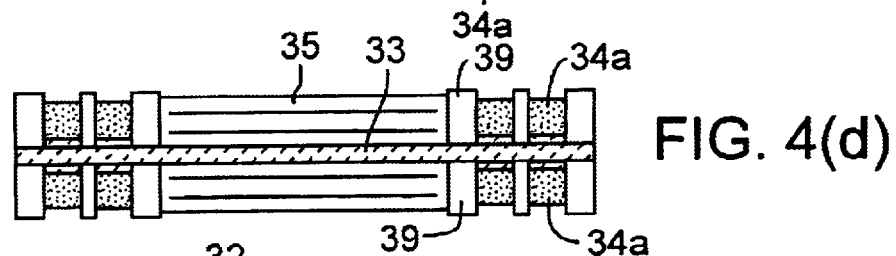
Figure 4E:
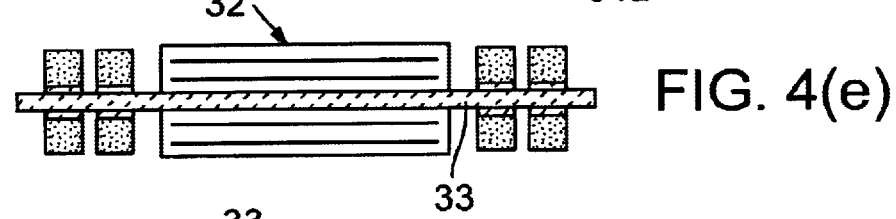
Figures 5A, 5B:
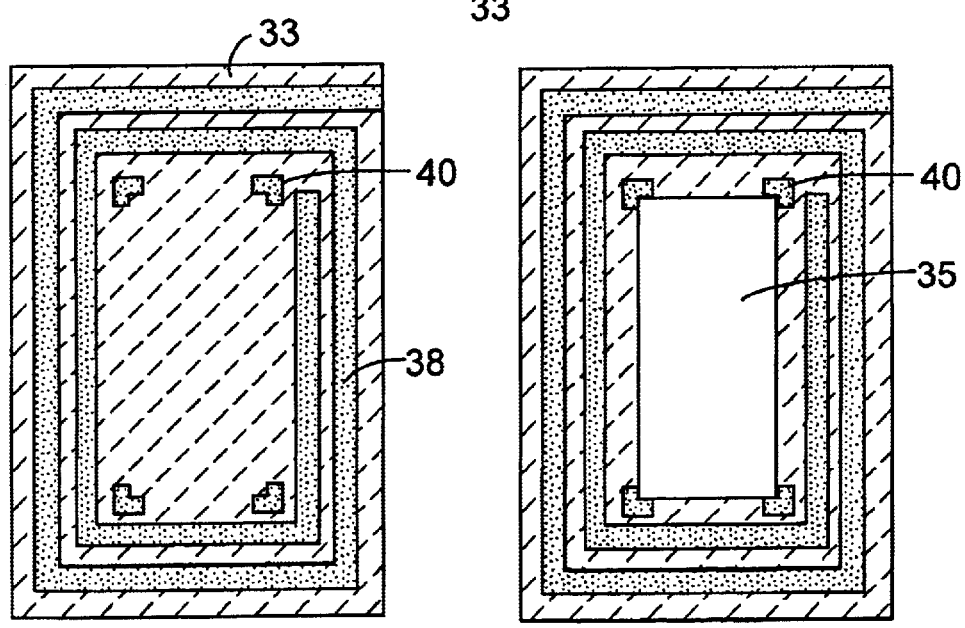
FIGS. 5(a)–5(b) depict the results of respective steps of a method, according to the fifth representative embodiment, for manufacturing a deflector, in which the cores (configured as magnetic-tape laminates) are positioned on the substrate with the aid of positioning features.

A third representative embodiment of a deflector 31 is shown in FIGS. 3(a)–3(b). The deflector 31 comprises multiple vanes 32 (only four shown in FIG. 3(a)) arranged equi-angularly around the axis 36 of the deflector 31. Each vane 32 comprises a respective pair of coils 34 that can be made, for example, by cutting (e.g., wire-cutting) respective copper sheets or by another process as described later below. A separate coil 34 is positioned on and applied to each of the first and second major surfaces, respectively, of respective quartz substrates 33. On each substrate 33, the constituent coils 34 wind in opposite directions and are connected together electrically at the inner terminus of each coil. Also located on the first and second major surfaces of each substrate 33 are respective cores 35 configured as respective magnetic-tape laminates. A respective core 35 is attached in the center of each coil 34.

The vanes 32, configured as described above and arranged in a radial pattern around the axis 36, form a vane-yoke type of deflector. Whenever an electrical current of an appropriate direction is delivered to each pair of coils 34 in the respective vanes 32, the respective cores 35 produce respective magnetic fields 37a having respective orientations as shown. The magnetic fields 37a produced by the cores 35 collectively augment the magnetic field 37b collectively produced by the coils 34. Accordingly, the deflector 31 produces a large deflecting field near the axis 36 in response to energization of the coils 34 with a relatively small electrical current.

FIGS. 4(a)–4(e) depict steps of a method, according to a fourth representative embodiment, for manufacturing a deflector. (Manufacture of only a single vane is shown, such as a vane of the deflector of FIG. 3(b).) First, a respective spiral pattern of electrically conductive metal 38 (e.g., copper) is formed on each major surface of a planar quartz substrate 33 by sputtering, electroless plating, or other suitable process (FIG. 4(a)). Each pattern of metal 38 is destined to be a respective electrode in a subsequent electrocasting process, and desirably conforms to the desired profile of the respective coils to be formed in a later step. Next, both major surfaces of the quartz substrate 33 are coated with a thick-film resist 39. The resists 39 are patterned into a desired coil profile by lithography. After removing non-cured resist (FIG. 4(b)), the remaining units of the thick-film resist 39 serve to limit the direction of metal growth, during subsequent electrocasting, to directions perpendicular to the substrate 33. Copper 34a is then deposited on the exposed patterns of metal 38 by electrocasting (FIG. 4(c)). As noted above, the lateral direction of growth of the copper 34a is limited by the units of thick-film resist 39. As a result, the copper 34a is deposited at a high aspect ratio. Meanwhile, the cores 35 are formed separately and worked as required into the desired shape by pressing or other mechanical working. The cores 35 are applied with an adhesive to the first and second major surfaces of the quartz substrate 33 while being positioned by respective units of the thick-film resist 39 (FIG. 4(d)). Finally, the thick-film resist 39 is removed to complete the vane 32 (FIG. 4(e)).

Although quartz desirably is used as the substrate 33 in this embodiment, it will be understood that the substrate alternatively may be made of alumina or other suitable material. In this alternative configuration, the spiral patterns of metal 38 may be applied to the substrate 33 by eutectic bonding to produce strong adhesion, rather than by sputtering or the like.

FIGS. 5(a)–5(e) depict steps of a method, according to a fifth representative embodiment, for manufacturing a deflector. (Manufacture of only a single vane is shown.) In the fourth representative embodiment described above, the cores 35 were positioned by adjacent units of the thick-film resist 39. In this fifth representative embodiment, in contrast, positioning features 40 (e.g., "marks") are formed on the substrate 33 by electrocasting of copper or other suitable material. After removing the units of thick-film resist 39 (FIG. 5(a); see corresponding steps in the fourth representative embodiment), the cores 35 are positioned on the substrate 33 as guided by the positioning features 40 and bonded in place (FIG. 5(b)). Desirably, the positioning features 40 are electrically insulated from contact with the cores 35 so as to effectively reduce eddy currents. Also, to avoid flow of eddy currents, the various magnetic-tape layers of the core 35 desirably are not electrically connected together.

Figure 6A:
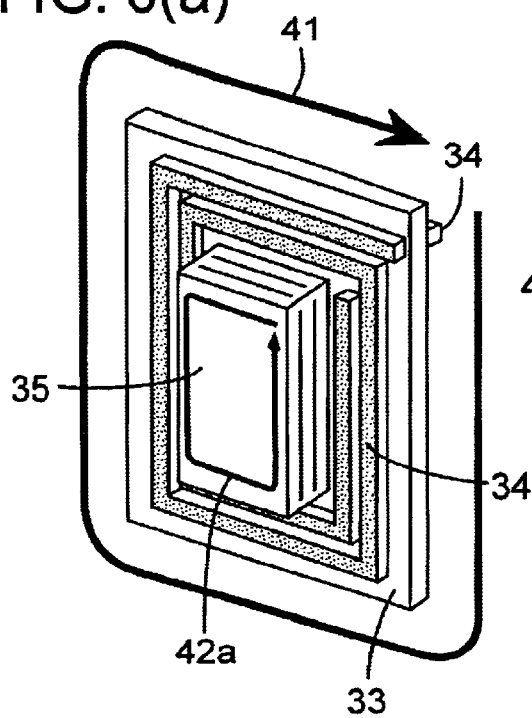
FIGS. 6(a)–6(d) depict an exemplary vane of a deflector according to the sixth representative embodiment, wherein, in each of FIGS. 6(a)–6(c), each core (configured as a respective magnetic-tape laminate) consists of one, two, and four equal-sized portions, respectively.
Figure 6B:
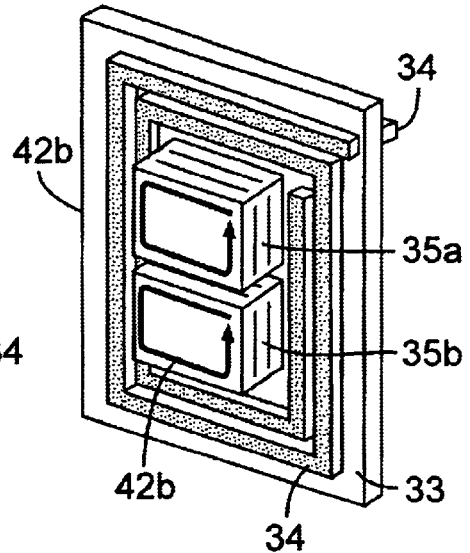
Figure 6C:
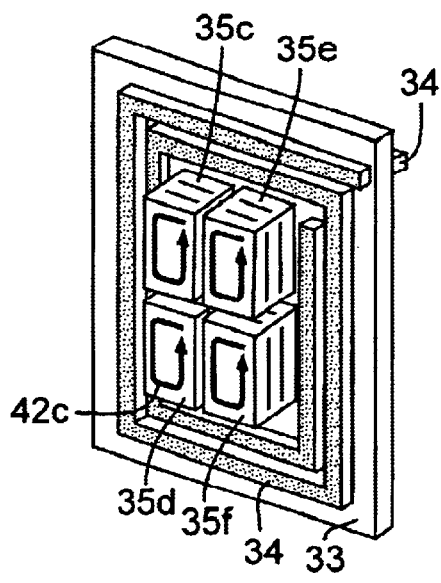
Figure 6D:
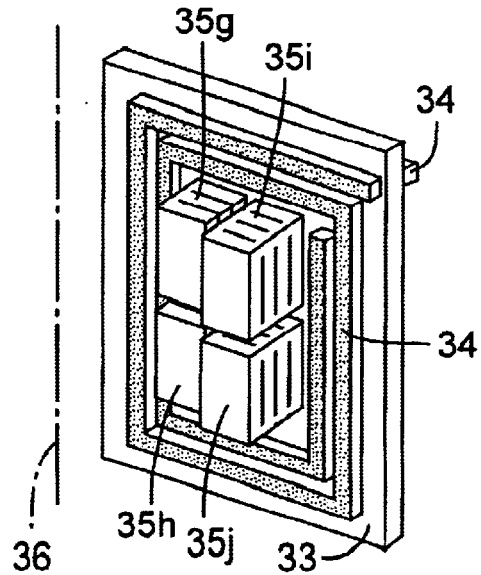

A deflector according to a sixth representative embodiment is shown in FIGS. 6(a)–6(d). Only a single vane of a vane-yoke type of deflector is shown. It will be recalled that, in the third representative embodiment, each core 35 was of a single respective unit structure. However, to reduce losses caused by eddy currents, the cores 35 can be divided into multiple respective segments, as shown in FIGS. 6(b)–6(d).

FIG. 6(a) shows the eddy current 42a inside a single-unit core 35 whenever electrical current flows to the respective coil 34. Whenever the electrical current flows in the direction indicated by the arrow 41, the respective eddy current flows in the directions indicated by the arrow 42a. As can be seen, the eddy current 42a flows in respective directions opposite the directions of the current 41 flowing through the coil 34. This counter-current flow partially cancels the magnetic field generated within the coil, which can adversely affect the response characteristics of the deflector. However, by dividing the core 35 into two respective core portions 35a, 35b (FIG. 6(b)), the magnitude of individual respective eddy currents 42b flowing in the cores 35a and 35b is reduced. If the eddy current is regarded effectively as a coil, then it can be seen that inductance is reduced in the configuration of FIG. 6(b) by more than half compared to the configuration of FIG. 6(a). This reduced induction is accompanied by a corresponding improvement in response characteristics of the deflector of FIG. 6(b) compared to the deflector of FIG. 6(a). The effect is even more enhanced by dividing the core 35 into four respective core portions, as shown in FIG. 6(c).

Turning to FIG. 6(d), the individual thicknesses of the core portions 35i, 35j (situated farther from the optical axis 36 than the other two core portions 35g, 35h) are increased relative to the individual thicknesses of the core portions 35g, 35h. As a result, the core portions 35i, 35j have greater individual volumes and thus produce stronger respective magnetic fields than the core portions 35g, 35h. The core portions 35i, 35j can have increased thicknesses in this manner because the distance between the vanes 32 in the vane-yoke deflector is greater with increased radial distance from the optical axis 36.

Figure 7A:
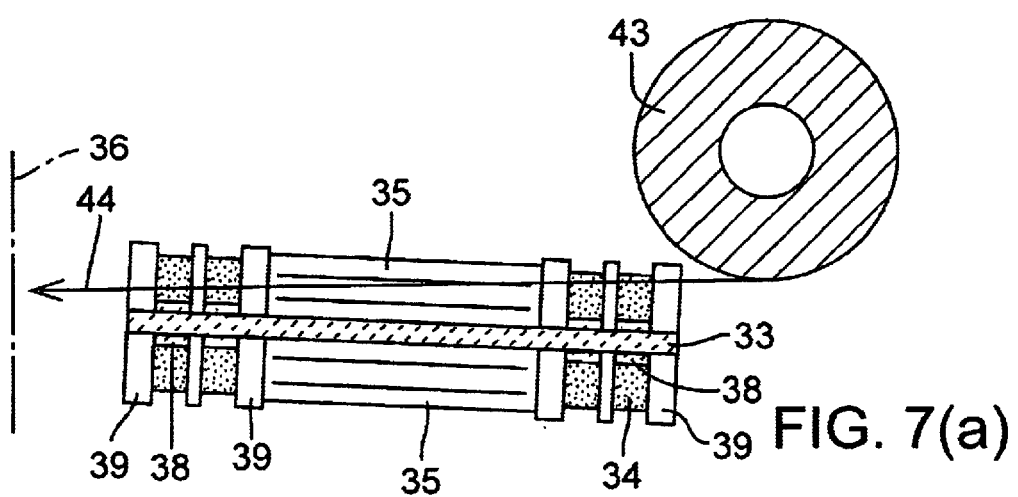
FIGS. 7(a)–7(b) depict the results of respective steps in a method, according to the seventh representative embodiment, for manufacturing a deflector, wherein the core (configured as a magnetic-tape laminate) is tapered in the radial direction.
Figure 7B:
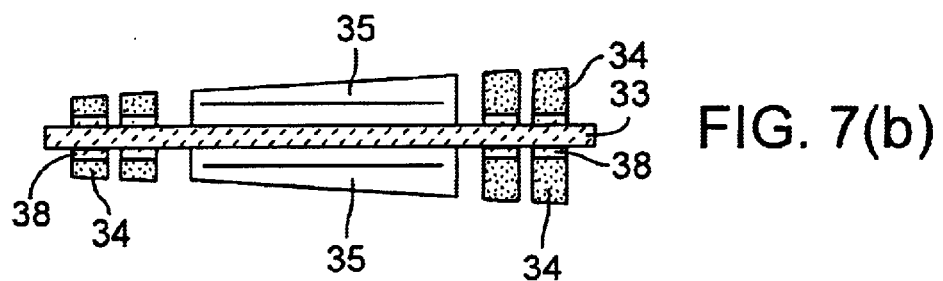

A method, according to a seventh representative embodiment, for manufacturing a deflector is shown in FIGS. 7(a)–7(b). (Manufacture of only a single vane of a vane-yoke deflector is shown.) It will be recalled that, in the sixth representative embodiment (specifically FIG. 6(d)), the core portions 35g, 35h and 35i, 35j had two different but discrete thicknesses. A similar effect can be obtained if, as shown in FIG. 7(a), the coils 34 and cores 35 are first formed thickly (thicker than required in the finished vane) on both sides of the substrate 33. This is followed by machining (e.g., cutting or grinding) of the upper surfaces of the cores and coils while tilting the substrate 33 at a specific angle relative to the cutting plane 44 of a machining tool 43. As a result of such machining, the cores 35 are configured so as to reduce unused space between adjacent vanes, thereby yielding maximum deflection intensity produced by the deflector. Also, since the thickness (and thus the cross-sectional area) of the coils 34 increases proportionately with distance from the optical axis 36, the electrical resistance of the coils 34 is reduced and the coils tend to generate less heat and impart a reduced load on the power supply used for exciting the coils 34. Another advantage of this method is that the thickness of copper 34a does not have to be precisely controlled during electrocasting.

A method, according to an eighth representative embodiment, for manufacturing a saddle deflector is shown in FIGS. 8(a)–8(f). In a first step of the method, the outer periphery of a cylindrical substrate 51 (desirably made of alumina) is metallized (e.g., with copper) to a thickness of about 3 $\mu$m by electroless plating or sputtering (FIG. 8(a)). The resulting metal layer 52 is used as an electrode in a later electrocasting step. Next, the cylindrical substrate 51 is placed endwise in a tank 53a containing photolithography resin 53b (FIG. 8(b)). Meanwhile, a laser beam 62 is directed at regions on the substrate 51 intended to be occupied by voids in the coils to be formed on the substrate. The resin 53b in regions exposed to the laser beam 62 is solidified. Exposure begins at the lowest portion of the cylindrical substrate 51 immersed into the resin 53b. As exposure progresses up the substrate 51, the substrate 51 is submerged further into the resin 53b, and the newly submerged portion of the substrate is irradiated with the laser beam 62. This scheme of progressive submersion of the substrate 51 and exposure using the laser beam 62 is continued as required to pattern the surface of the substrate 51 with resin.

Figure 8A:
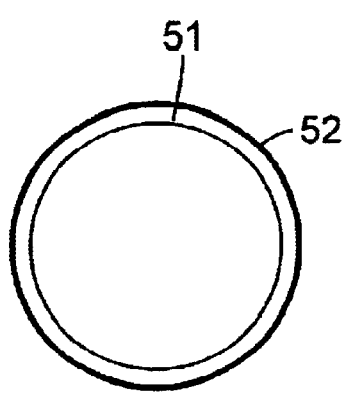
FIGS. 8(a)–8(f) depict the results of respective steps in a method, according to the eighth representative embodiment, for manufacturing a deflector.
Figure 8D:
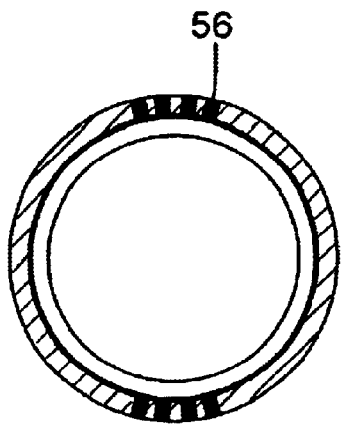
Figure 8B:
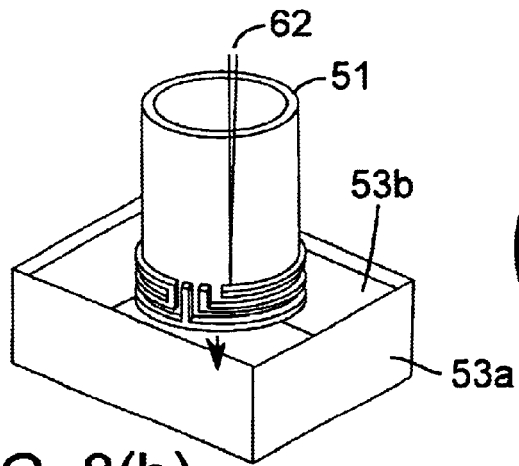
Figure 8E:
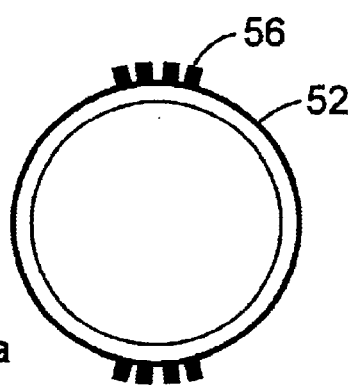
Figure 8C:
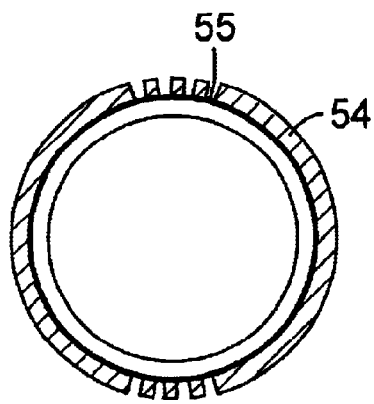
Figure 8F:
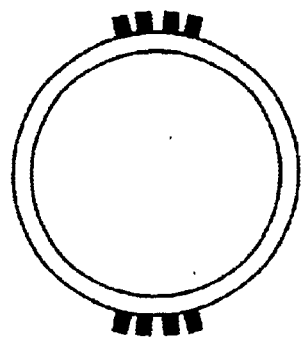

FIG. 8(c) is an exemplary transverse section of patterned resin 54 formed on the cylindrical substrate 51 in this manner. The patterned resin 54 defines voids 55 in which respective coils will be formed. Actual coils 56 are formed in the voids 55 by electrocasting copper in the voids (FIG. 8(d)). The cylindrical substrate 51 is then placed in a vacuum furnace at about 800° C. to ash the resin 54 while leaving the metal layer 52 and the coil 56 on the surface of the substrate 51 (FIG. 8(e)). These thermal conditions also cause the metal layer 52 to bond eutectically with the substrate 51, thereby increasing the adhesion of the metal layer 52. Finally, exposed portions of the metal layer 52 are etched away using, e.g., a ferric chloride etchant solution (FIG. 8(f)). Finally, wires (not shown) are attached to respective ends of the coils 56, thereby completing fabrication of the saddle deflector 50.

Figure 9A:
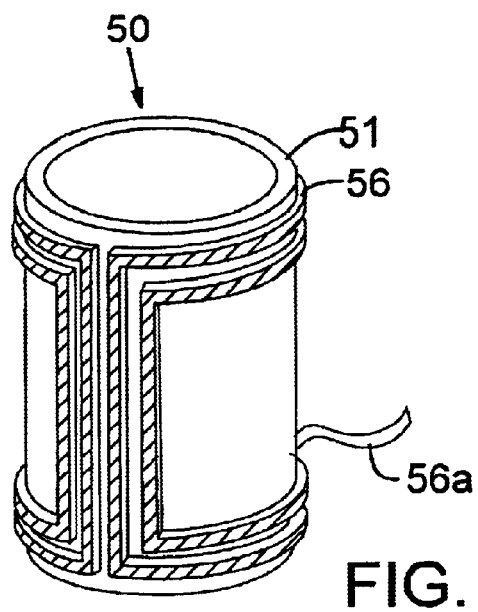
FIG. 9(a) is an oblique view of a deflector manufactured by the method of FIGS. 8(a)–8(f).
Figure 9B:
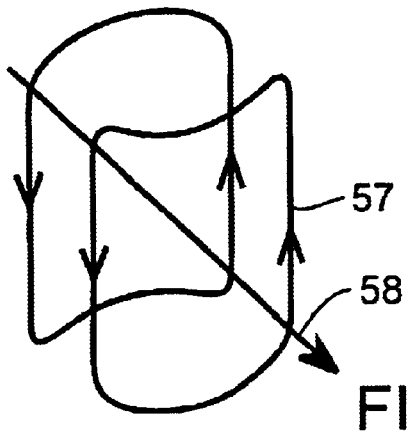
FIG. 9(b) is an oblique view of the deflector of FIG. 9(a), showing the directions of current flow through the deflector coils and the direction of the resulting beam-deflecting field generated by the electrical current.
Figure 9C:
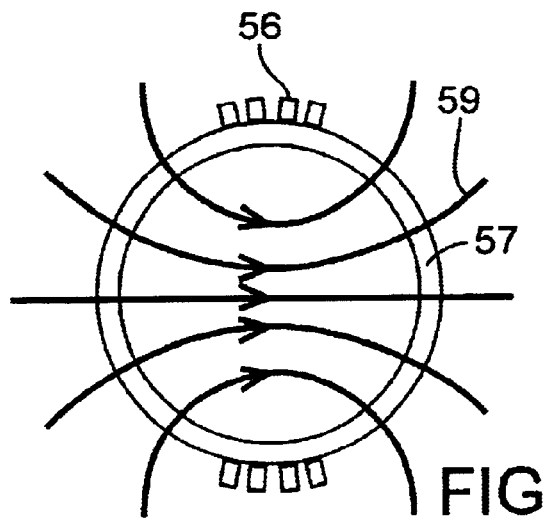
FIG. 9(c) is an end view of the deflector of FIG. 9(a), showing lines of force indicating the beam-deflecting field produced by the deflector.
Figure 10A:
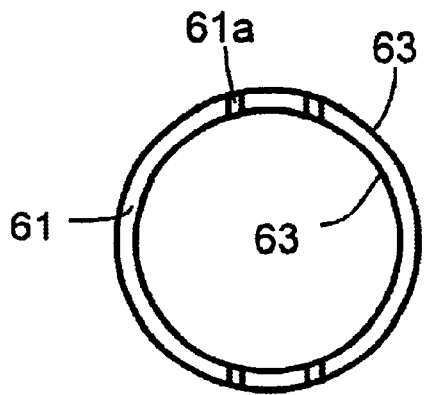
FIGS. 10(a)–10(e) depict the results of respective steps in a method, according to the ninth representative embodiment, for manufacturing a deflector.
Figure 10B:
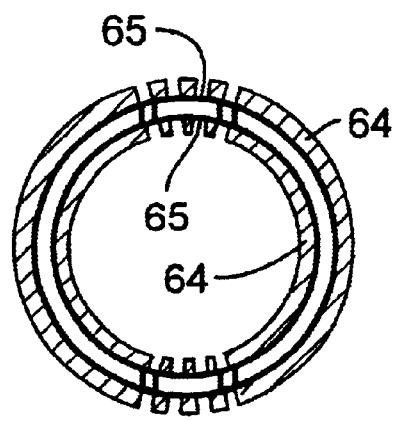
Figure 10C:
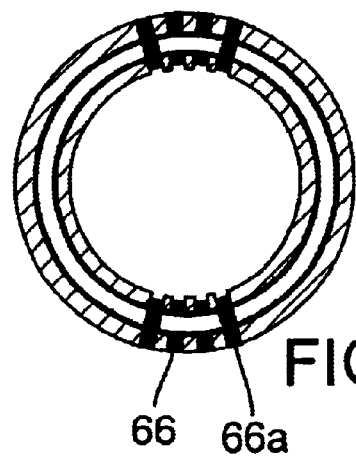
Figure 10D:
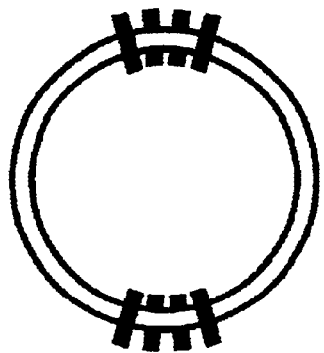
Figure 10E:
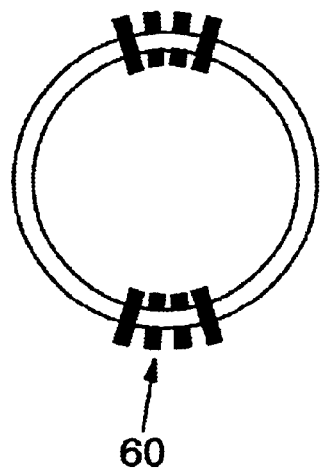

Operation of the completed saddle deflector 50 is described with reference to FIGS. 9(a)–9(c). FIG. 9(a) shows the copper coil 56 formed at a high aspect ratio over the cylindrical substrate 51. Whenever electrical current (delivered by wires 56a) flows through a coil 56 in the respective direction 57 indicated in FIG. 9(b), a corresponding deflection field 58 is generated in the direction shown (arrow). An electron beam can be deflected laterally using these deflection fields 58. A transverse section of the deflector 50 is shown in FIG. 9(c), in which a magnetic field 59 is depicted that is generated by supplying electrical current to the coil 56.

A method, according to a ninth representative embodiment, for manufacturing a saddle-deflector is shown in FIGS. 10(a)–10(e). In a first step, a cylindrical substrate 61 (desirably made of alumina) is prepared by forming conduction through-holes 61a at desired locations on the substrate. The inner and outer surfaces of the alumina substrate 61 are metallized (desirably using copper) to a thickness of about 3 μm by electroless plating or sputtering (FIG. 10(a)). The metallization layers 63 are used as respective electrodes in a later electrocasting step. Next, the cylindrical substrate 61 is immersed progressively endwise into a tank containing a photolithography resin (not shown, but see FIG. 8(b)). Meanwhile, a laser beam is directed at regions of the immersed substrate (on the inside and outside surfaces) intended to be occupied by voids in the coils to be formed on the substrate. Exposure to the laser beam locally solidifies the resin, as discussed above. Exposure is continued until the entire surface (i.e., both inside and outside surfaces) of the substrate 61 is patterned with the solidified resin 64 in the desired manner to define intended locations of coils (FIG. 10(b)). Note that the voids 65 on the inside surface and the voids 65 on the outside surface of the substrate 61 are patterned in a mirror-image manner so as to form, in a subsequent step, coils "wound" in opposite directions. Next, coils 66 are formed in the voids 65 by copper electrocasting, which also forms coil connectors 66a in the through-holes 61a so as to electrically connect the inner and outer coils 66 together (FIG. 10(c)). The substrate 61 then is placed in a vacuum furnace at about 800° C. to ash the remaining resin 64, leaving the metallization layer 63 and coils 66 on the cylindrical substrate 61 (FIG. 10(d)). Under these conditions, the metallization layer 63 eutectically bonds with the substrate 61, thereby increasing the adhesion of the metallization layer 63. Finally, exposed regions of metal 63 are etched away using, e.g., a ferric chloride etchant solution, after which the coils 66 are wired to complete fabrication of the saddle deflector 60 (FIG. 10(e)).

When wiring the coils 66, since the through-holes 61a form electrical connections of the inside ends of the inner and outer coils 66, wiring is attached to the outside ends of the inner and outer coils 66. Since passage of electrical current through such wiring generates local magnetic fields, the wiring to the deflector 60 desirably is no longer than necessary. Also, individual pairs of wires (current-in and current-out wires) desirably are twisted together so as to cancel the local magnetic fields produced by the wires (and thus canceling any aberrations that otherwise could be caused by the local magnetic fields). Forming coils 66, as described above, on both the inside and outside surfaces of the substrate 61 results in a larger number of coil windings than forming coils only on one side of the substrate. The greater number of coil windings produces a more powerful magnetic field using less electrical power. Also, since the wiring connecting the inner coil to the outer coil is kept as short as possible, the resulting saddle deflector 60 exhibits very low aberration.

The eighth and ninth representative embodiments described above pertained to respective methods for manufacturing a saddle deflector capable of deflecting a charged particle beam in only one direction relative to the optical axis. In actual practice, however, a charged particle beam usually must be deflected bidirectionally. Hence, there is a need for saddle deflectors capable of bidirectional (e.g., X and Y) deflection. (This bidirectional deflection is termed "biaxial" deflection.) This need is met by the tenth representative embodiment, shown in FIGS. 11(a)–11(b).

Figure 11A:
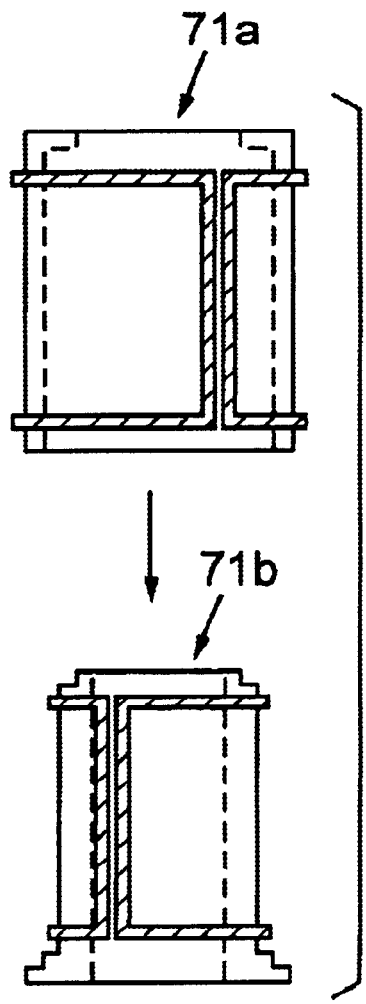
FIGS. 11(a)–11(b) are elevational views showing certain details of a deflector according to the tenth representative embodiment.
Figure 11B:
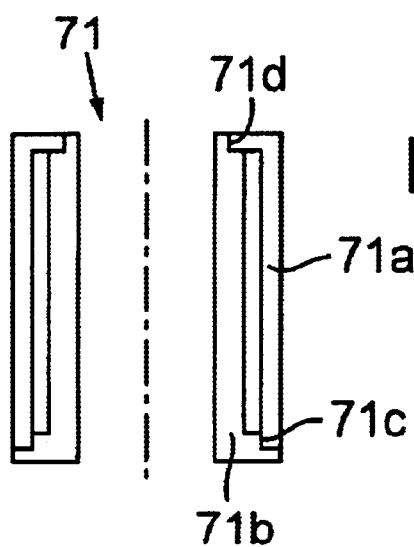
Figure 12A:
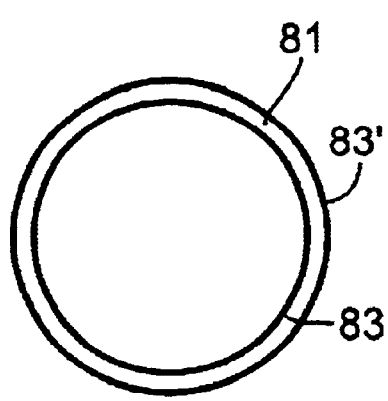
FIGS. 12(a)–12(e) depict the results of respective steps in a method, according to the eleventh representative embodiment, for manufacturing a deflector.
Figure 12B:
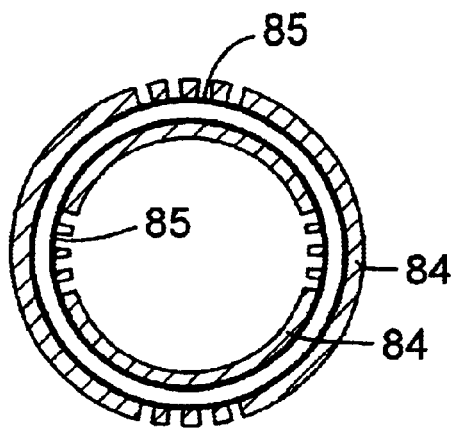
Figure 12C:
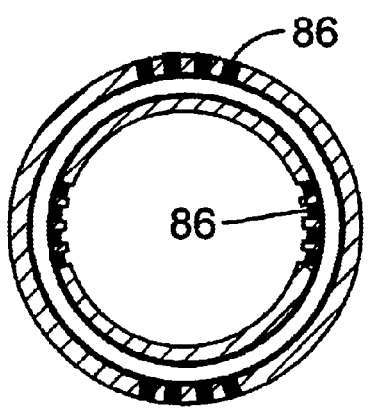
Figure 12D:
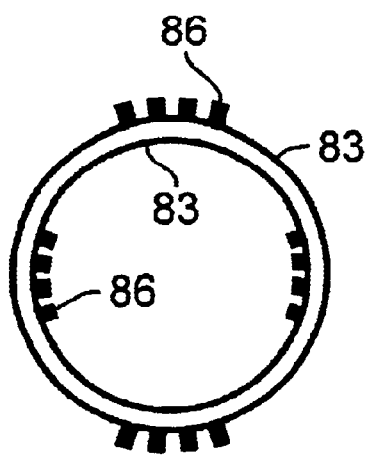
Figure 12E:
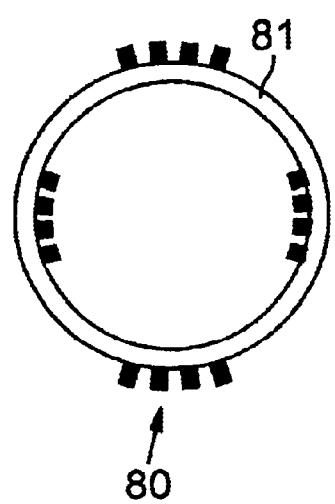

Referring to FIG. 11(b), the biaxial deflector 71 is shown, comprising an X-directional deflector 71a configured to deflect the beam in the X-direction, and a Y-directional deflector 71b configured to deflect the beam in the Y-direction. As shown in FIG. 11(a), the Y-axis deflector 71b has an outside diameter that is slightly smaller than the inside diameter of the X-axis deflector 71a. Hence, the Y-axis deflector 71b is axially inserted into the X-axis deflector 71a. The resulting biaxial deflector 71 is sized no larger than a uniaxial deflector, but has the functionality of a biaxial deflector. Each of the deflectors 71a and 71b is provided with a respective circular flange 71c, 71d. Consequently, there is only one possible three-dimensional positional relationship between the X-axis deflector 71a and the Y-axis deflector 71b.

A method, according to an eleventh representative embodiment, for manufacturing a deflector is shown in FIGS. 12(a)–12(e). In a first step a cylindrical substrate 81 (desirably made of alumina) is prepared. The inside and outside surfaces of the substrate 81 are metallized (desirably with copper) to a thickness of about 3 μm by electroless plating or sputtering (FIG. 12(a)). The resulting metal layers 83, 83' are used as respective electrodes in a later electrocasting step. Next, the substrate 81 is immersed progressively endwise into a tank containing a photolithography resin (not shown), as described above. As each portion of the substrate is immersed into the resin, a laser beam is directed at the inner and outer surfaces destined to be occupied by voids in the coils to be formed on the substrate. After both surfaces of the substrate 81 have been patterned with cured resin 84 in this manner, it can be seen that the voids 85 on the outside surface are rotated by 90 degrees around the optical axis relative to the voids 85 on the inside surface (FIG. 12(b)). The voids 85 are filled with copper by copper electrocasting (FIG. 12(c)) to form the coils 86. Next, the substrate 81 is placed in an 800° C. vacuum furnace to ash remaining resin 84, leaving the metal layer 83 and coils 86 formed on the substrate 81 (FIG. 12(d)). This thermal condition also eutectically bonds the metal layer 83 to the substrate 81. Finally, exposed portions of the metal 83 are etched away using, e.g., a ferric chloride etchant solution. The coils 86 are wired to complete fabrication of the saddle deflector 80 (FIG. 12(e)). The resulting biaxial deflector 80 comprises coils that are shifted, relative to each other, by 90 degrees around the optical axis.

Figure 13A:
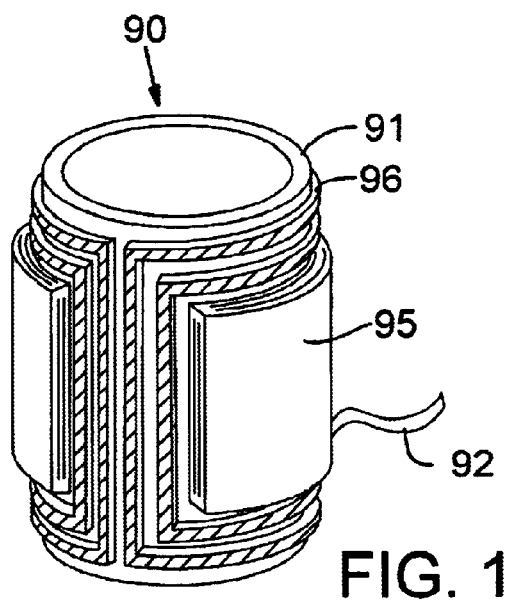
FIG. 13(a) is an oblique view of a deflector according to the twelfth representative embodiment.
Figure 13B:
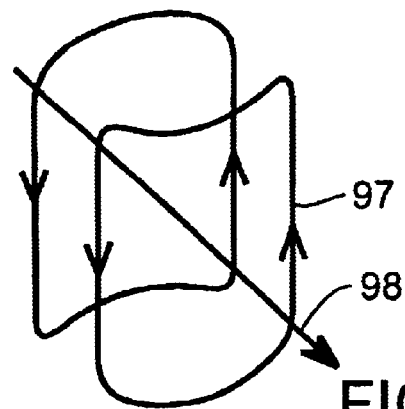
FIG. 13(b) is an oblique view of the deflector of FIG. 13(a), showing the directions of current flow through the deflector coils and the direction of the resulting beam-deflecting field generated by the electrical current.
Figure 13C:
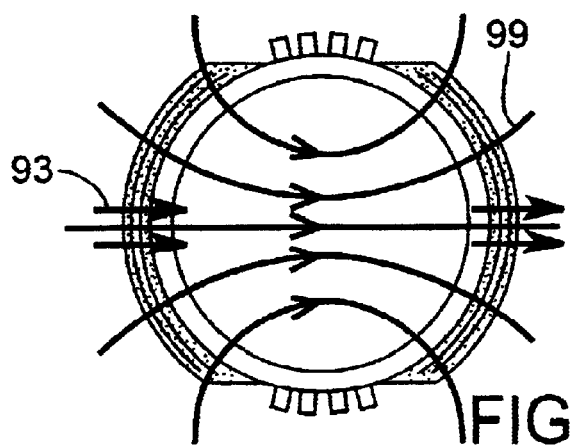
FIG. 13(c) is an end view of the deflector of FIG. 13(a), showing lines of force indicating the beam-deflecting field produced by the deflector.

A saddle deflector according to a twelfth representative embodiment is depicted in FIGS. 13(a)–13(c). This embodiment is similar to that shown in FIG. 9(a), except that, in the instant embodiment, the deflector 90 includes cores 95 (configured as respective magnetic-tape laminates) situated in the middle of respective coils 96. Whenever electrical current (delivered by wires 92) flows through the coils 96 in the respective directions 97 shown in FIG. 13(b), a beam-deflecting magnetic field indicated by the line 98 is produced. Lines of force 99 denoting this beam-deflecting field are shown in FIG. 13(c). The cores 95 may be in a state of dielectric polarization so that they produce respective fields 93 that enhance the beam-deflecting magnetic field at the optical axis, as shown in FIG. 13(c), compared to the magnetic field that otherwise would be produced by the deflector of FIG. 9(a).

Figure 14A:
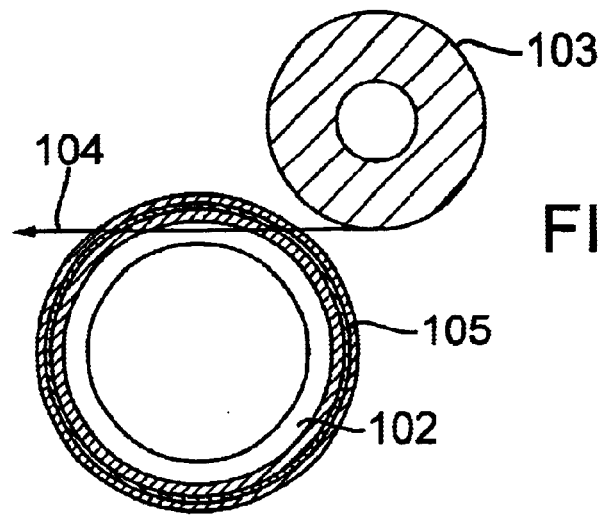
FIGS. 14(a)–14(c) depict the results of respective steps in a method, according to the thirteenth representative embodiment, for manufacturing a deflector.
Figure 14B:
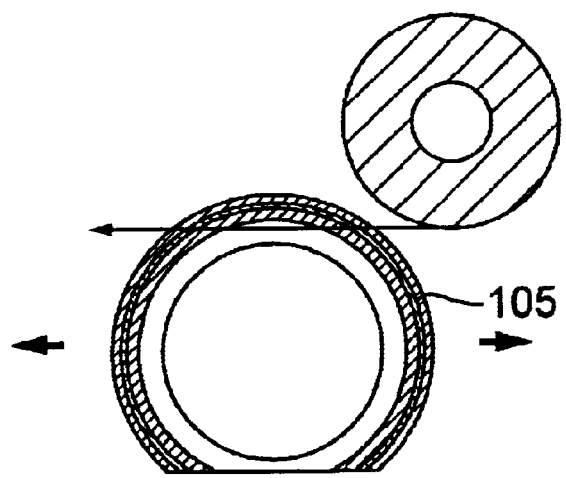
Figure 14C:
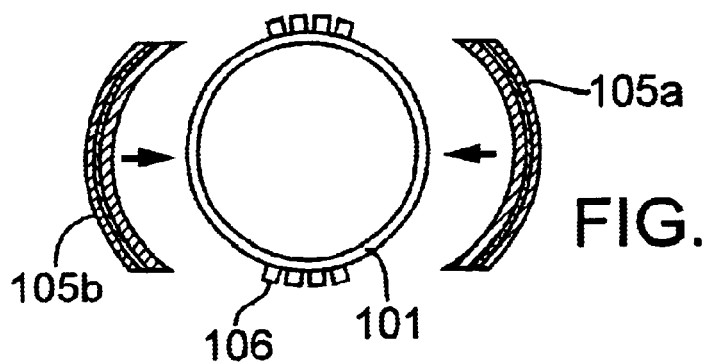

A method, according to a thirteenth representative embodiment, for manufacturing a deflector is shown in FIGS. 14(a)–14(c). As shown in FIG. 14(a), a magnetic tape is wound around a cylindrical mold 102, and the layers thus formed are bonded together to form a magnetic-tape laminate 105. The layers may be electrically insulated from one another and from the cylindrical mold 102 by using magnetic tape having one side that is an insulator or by inserting insulators between the layers of magnetic tape. After formation, the magnetic-tape laminate 105 is ground or cut into two portions using a cutter 103 advancing along the line 104. The resulting portions of magnetic-tape laminate 105 are removed from the cylinder 102 (FIG. 14(b)) and placed on and bonded as respective core portions 105a, 105b to a cylindrical substrate 101 of a saddle deflector according to, for example, the eighth representative embodiment (FIG. 14(c)). Positioning of the core portions 105a, 105b on the substrate 101 can be performed accurately and quickly if local protrusions (not shown) or other features useful for positioning the core portions 105a, 105b are provided on the substrate 101 during the earlier photolithography or electro-casting steps. This method of attaching the core portions 105a, 105b also can be utilized when manufacturing deflectors, according to the invention, produced by methods other than methods involving photolithography. Also, if the magnetic-tape laminate 105 is divided into multiple core portions, as described above (see, e.g., FIGS. 6(a)–6(d)), not only will substantially the same magnetic field strength be obtained as with laminates that are not divided, but also eddy currents can be reduced. Such reduction of eddy currents decreases the time constant of the deflector.

Figure 15:
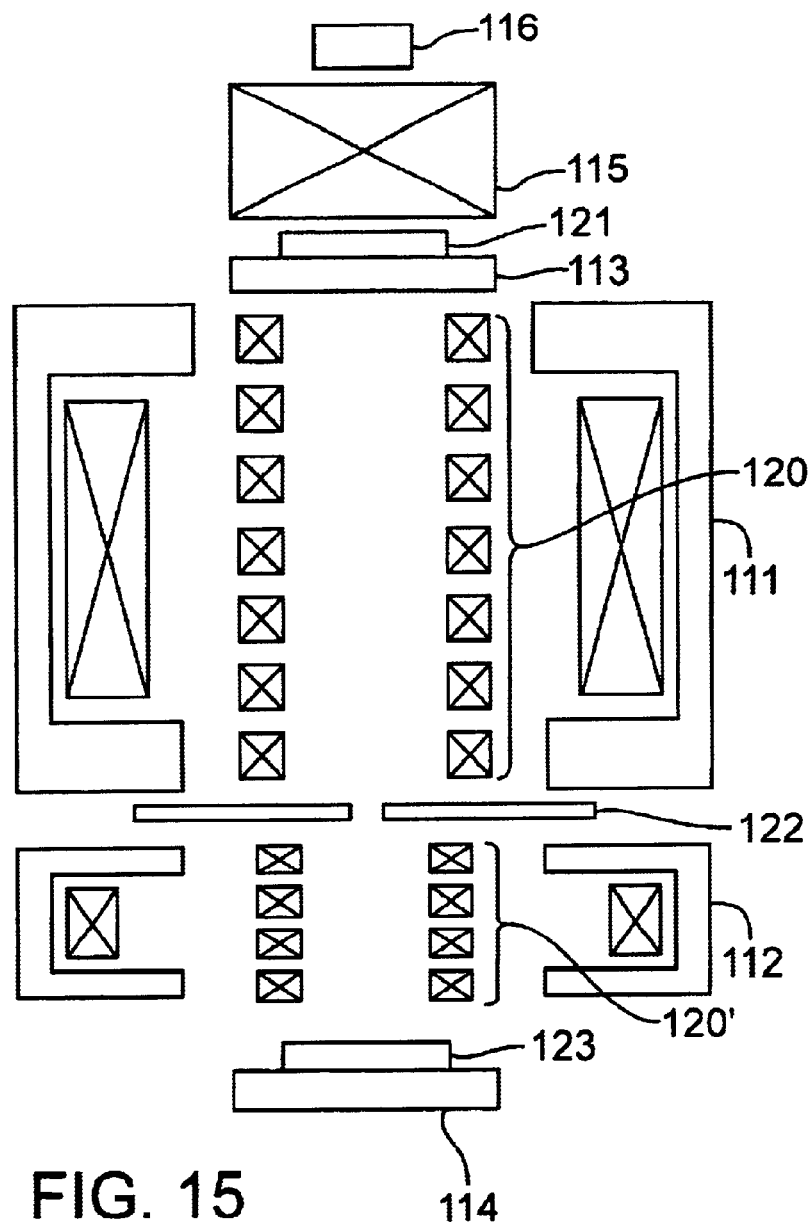
FIG. 15 is an elevational schematic diagram of an exemplary embodiment of a charged-particle-beam microlithography system that includes one or more deflectors as disclosed herein.
Figure 16A:
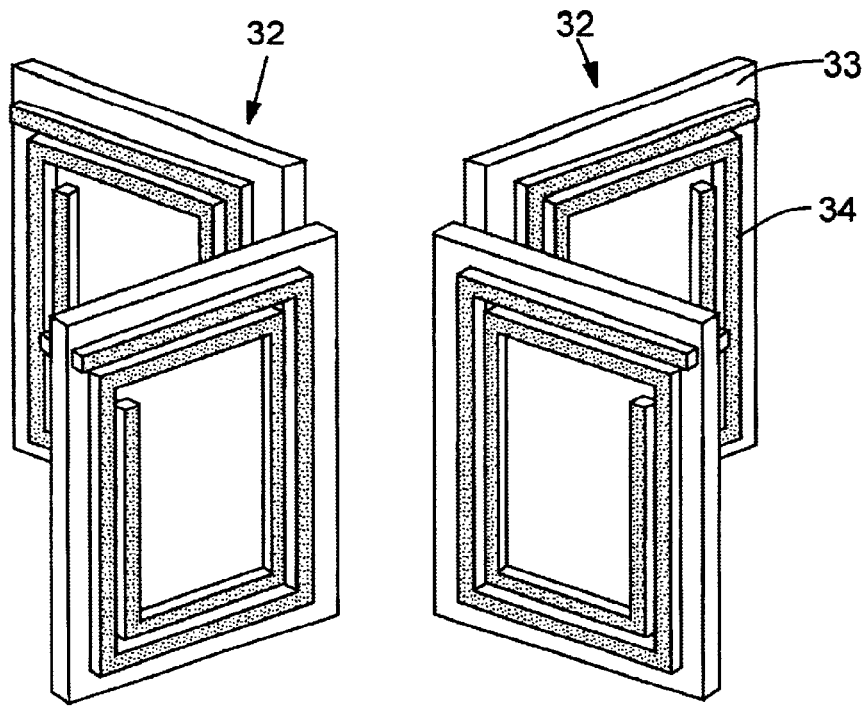
FIG. 16(a) is an oblique view of a conventional vane-yoke deflector, showing four vanes.
Figure 16B:
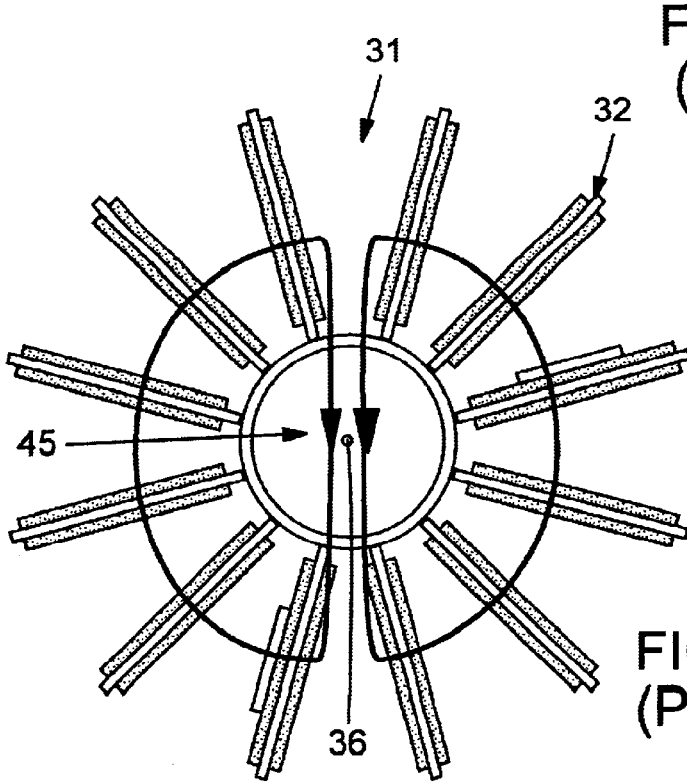
FIG. 16(b) is an axial end view of the deflector of FIG. 16(a), showing twelve vanes and lines of force indicating the beam-deflecting magnetic field produced by the deflector.
Figure 17A:
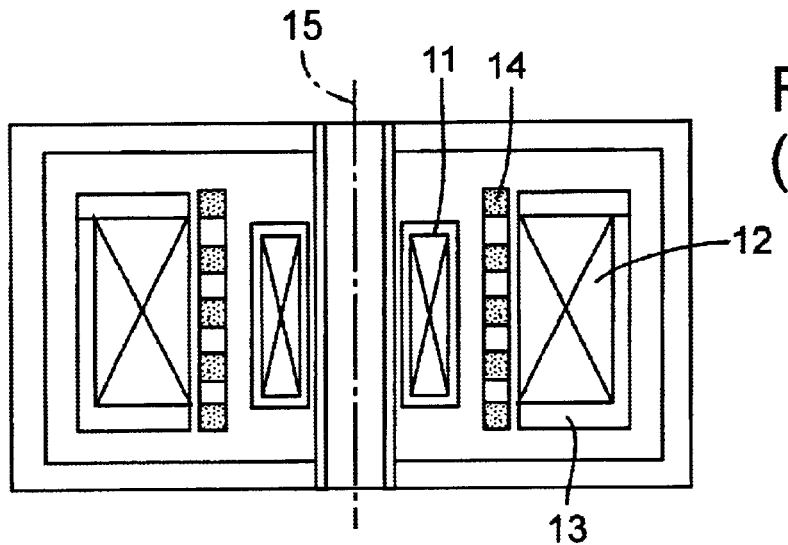
FIG. 17(a) is an elevational section of a conventional lens-deflector unit.
Figure 17B:
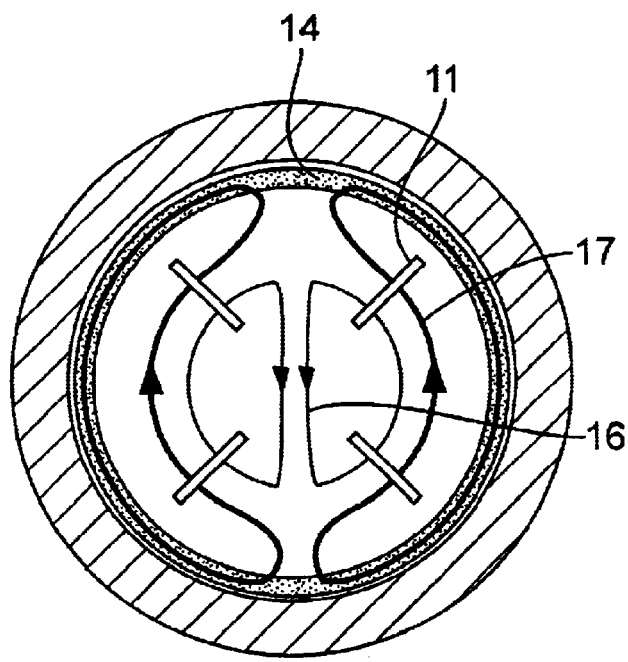
FIG. 17(b) is an axial end view of the combination of FIG. 17(a), showing lines of force denoting the magnetic fields produced by the lens-deflector unit.

FIG. 15 depicts a representative embodiment of an electron-beam microlithography system 110 comprising one or more deflectors as described above. the system comprises an electron gun 116, an illumination-optical system 115, a reticle stage 113 (for holding a pattern-defining reticle 121), a first projection lens 111, a scattering aperture 122, a second projection lens 112, and a wafer stage 114 (for holding a "sensitive" substrate 123). The electron gun 116 produces an electron beam that propagates in a downstream direction from the electron gun 116. The electron beam passes (as an "illumination beam") through the illumination-optical system 115 and irradiates a selected region of the reticle 121. As the illumination beam passes through the illuminated portion of the reticle 121, the beam acquires an aerial image of the illuminated portion and thus becomes a "patterned beam" propagating downstream of the reticle. The patterned beam passes through the projection lenses 111, 112, which collectively demagnify the aerial image and focus the aerial image on the surface of the substrate 123.

The system of FIG. 15 includes a deflector 120' situated inboard relative to the second projection lens 112 and a deflector 120 situated inboard relative to the first projection lens 111. Even though the figure shows seven deflectors 120 associated with the first projection lens 111 and four deflectors 120' situated relative to the second projection lens 112, such a configuration is not intended to be limiting; other numbers and placements of deflectors alternatively can be used, depending upon the specific task(s) to be performed by the deflectors. Each deflector 120, 120' can be configured according to any of the various representative embodiments described above, and the various embodiments of deflectors can be used in any combination with each other. Also, the deflector(s) 120, 120' can be integrated with the respective magnetic lens in a manner such as in the embodiment of FIGS. 2(a)–2(c), thereby combining the functions of deflector and lens in a single component.

Also, although the deflectors 120, 120' in FIG. 15 are shown associated with the projection lenses 111, 112, the deflectors also or alternatively can be used in association with the illumination-optical system 115.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A method for manufacturing a vane for use in a vane-yoke deflector utilized in a charged-particle-beam optical system, comprising:

forming a metal film in a coil pattern on a surface of a planar substrate;

coating the surface of the substrate with a thick-film resist;

patterning the resist into a desired coil profile corresponding to the coil pattern of metal film;

selectively removing portions of the resist to form a coil pattern in the resist and a respective core location;

depositing a conductive metal in the coil pattern to form a respective coil;

attaching a core on the surface of the substrate at the core location, the core comprising a laminate of magnetic tape; and removing remaining thick-film resist.

2. The method of claim 1, further comprising, after removing the remaining resist, of etching away exposed portions of the metal layer.

3. The method of claim 1, wherein the core is attached to the surface of the substrate using an adhesive.

4. The method of claim 1, further comprising the step of dividing the core into multiple respective core segments that are electrically insulated from one another.

5. The method of claim 1, further comprising the step of machining the core to a desired shape.

6. The method of claim 5, wherein the core is machined such that the surface of the core defines a plane oriented at an angle to the substrate plane.

7. The method of claim 5, wherein the core is machined to provide the core with a cross-sectional area that increases proportionately with distance from an optical axis.

8. The method of claim 1, further comprising the step of forming multiple positioning features on the substrate, wherein the step of attaching the core comprises placing the core at a position at the core location defined by the multiple positioning features.

9. The method of claim 8, further comprising the step, before the step of attaching the core, of electrically insulating the positioning features.

* * * * *